United States Patent [19]
Ahn

[11] Patent Number: 5,156,984
[45] Date of Patent: Oct. 20, 1992

[54] MANUFACTURING METHOD FOR A BI-CMOS BY TRENCHING

[75] Inventor: Hyeong K. Ahn, Seoul, Rep. of Korea

[73] Assignee: Goldstar Co., Ltd., Seoul, Rep. of Korea

[21] Appl. No.: 291,676

[22] Filed: Dec. 29, 1988

[30] Foreign Application Priority Data

Dec. 31, 1987 [KR] Rep. of Korea ............ 15706

[51] Int. Cl.$^5$ ......................... H01L 21/265
[52] U.S. Cl. ......................... 437/31; 437/59; 437/41; 437/57; 437/203; 357/43; 357/23.4
[58] Field of Search ............ 437/31, 32, 33, 59, 437/34, 56, 57, 58, 54, 203, 141, 160, 162, 187; 156/657; 357/34, 43; 148/DIG. 9

[56] References Cited

U.S. PATENT DOCUMENTS

| | | | |
|---|---|---|---|
| 4,704,456 | 11/1987 | Thomas | 437/59 |
| 4,752,589 | 6/1988 | Schaber | 437/34 |
| 4,772,567 | 9/1988 | Hirao | 437/59 |
| 4,778,774 | 10/1988 | Blassfeld | 357/43 |
| 4,826,783 | 5/1989 | Chai | 148/DIG. 9 |

FOREIGN PATENT DOCUMENTS 0148546  5/1981  Fed. Rep. of Germany ........ 437/59
0043688  4/1979  Japan ............................ 437/59

OTHER PUBLICATIONS

Blum, J. "Formation of Integrated ..." vol. 15, No. 2, Jul. 1972, pp. 441–442.

Primary Examiner—Brian E. Hearn
Assistant Examiner—Kevin McAndrews
Attorney, Agent, or Firm—Birch, Stewart, Kolasch & Birch

[57] ABSTRACT

A manufacturing method for a Bi-CMOS by trenching which is allowed to manufacture the bipolar celement and CMOS element simultaneously on one substrate by trench etching, comprising the processes of growing an oxide layer, forming N+ buried layer, growing n-type epitaxial layer after removing the oxide layer, growing again an oxide layer, a plurality of isolation regions being formed by diffusing a boron impurity, the base regions as well as the collector, emitter and drain regions are formed, the trenched grooves are formed after removing said oxide layer, an oxide layer is grown after inverting the epitaxial layer, the electrode window is opened, and a metal such as alminium is deposited thereby the electrode terminals of base, emitter and collector of bipolar element and also the drain, source and gate of CMOS are drawn out, respectively.

1 Claim, 4 Drawing Sheets

MANUFACTURING METHOD FOR A BI-CMOS BY TRENCHING

BACKGROUND OF THE INVENTION

The present invention relates to a Bi-CMOS element, specifically relates to a manufacturing method for a Bi-CMOS which is allowed to manufacture simultaneously a bipolar element and a CMOS element by the formation of trenching on one substrate.

Heretofore, the bipolar element and the CMOS element have been respectively manufactured separately, and a general manufacturing process of the bipolar element is shown in FIG. 1(A)–(G), while a general manufacturing process of CMOS element which is a memory element is shown in FIG. 2(A)–(F).

In manufacturing a bipolar element, firstly as shown in FIG. 1(A), a silicon oxide ($SiO_2$) layer 2 is formed on a p-type silicon substrate 1 thereafter said oxide layer 2 is selectively etched and the only predetermined portion of p-type silicon substrate 1 is exposed, and as shown in FIG. 1 (B) a n-type impurity of high density is doped on the exposed portion of the p-type silicon substrate 1, and then is diffused so that a $N^+$ buried layer 3 for the decrease of continuous resistance of collector is formed. Then as shown in FIG. 1(C), said silicon oxide layer 2 is removed, after growing a n-type epitaxial layer 4 as shown in FIG. (D) a thermal oxidation film 5 is formed on the surface of said epitaxial layer 4 by a predetermined thickness, then said thermal oxidation film 5 is selectively etched by a photoetching, and a phosphor (P) which is a n-type impurity is doped at said selectively etched portion, then is diffused to the interior so that an isolated region 6 is formed. Then as shown in FIG. 1(E), said thermal oxidation film 5 is selectively etched by a photoetching, after p-type impurity is doped a base region 7 is formed by a thermal diffusion, then as shown in FIG. 1(F) said thermal oxidation film 5 is selectively etched, after a phosphor oxide film is doped then an emitter region 8 and a collector region 9 are formed respectively.

Then as shown in FIG. 1(G), said thermal oxidation film 5 is removed, and a metal oxide film 10 is formed, and said metal oxide layer 10 is selectively etched by a photoetching and then metal oxide window is obtained, thereafter a metal is deposited over said metal oxide window and then electrode terminals 11,12,13 are drawn out from said base region 7, emitter region 8 and collector region 9, so that the manufacturing of a bipolar element is completed.

On the other hand, in manufacturing a CMOS element which is a memory element, firstly as shown in FIG. 2(A), an oxide layer 22 is formed on the surface of n-type silicon substrate 21, thereafter as shown in FIG. 2(B) said oxide layer 22 is selectively etched by masking and etching process, and a p-type well 23 is formed by diffusing a p-type impurity through said selectively etched portion, then as shown in FIG. 2(C), after said oxide layer 22 is selectively etched, a p-type impurity such as boron is diffused, so that a source region 24 and a drain region 25 of p-channel are formed. Then, as shown in FIG. 2(D), a source region 26 and a drain region 27 of n-channel are formed by diffusing a phosphor which is a n-type impurity within said p-type well 23, then as shown in FIG. 2(E), after said oxide is removed, another oxide layer 22 is formed again, and said oxide layer 22 is selectively etched then a gate region 28 is formed, so that a boron is filled within said gate region 28 for the reinforcement of threshold voltage thereafter a polycrystal silicon 29 is fused therewith. Then as shown in FIG. 2(F), after the electrode window is opened and then aluminum is deposited over entire surface, the masking and etching are carried out thereby unnecessary portions connected between the source, drain and gate are removed so that the manufacturing of CMOS element is completed.

However, in such a conventional manufacturing method of bipolar element and CMOS element, there has been no way except to manufacture separately the bipolar element and CMOS element respectively, therefore in case where they are applied to a communication and various electronic appliances which the bipolar element and CMOS element are simultaneously required, the number of the parts are increased, consequently there has been a defect that their assembling work becomes troublesome or the like due to the increase of the number of their parts.

SUMMARY OF THE INVENTION

Therefore, an object of the present invention is to provide a manufacturing method for a Bi-CMOS element which a bipolar element and CMOS element can be simultaneously manufactured on a same substrate.

The object of the present invention is attained by manufacturing the CMOS element by trenching during the manufacturing process of bipolar element, which will be explained in detail with reference to the accompanying drawings as follows.

DETAILED DESCRIPTION OF THE INVENTION

Figure 1A:
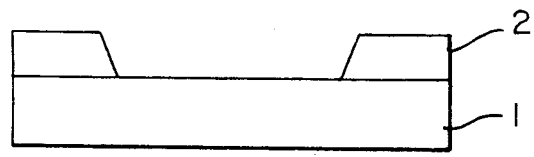
FIGS. 1(A)–(G) are the diagrams of manufacturing process of a conventional bipolar element.
Figure 1B:
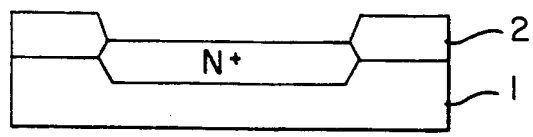
Figure 1C:
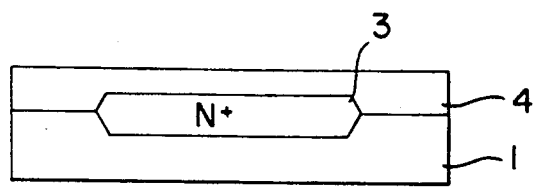
Figure 1D:
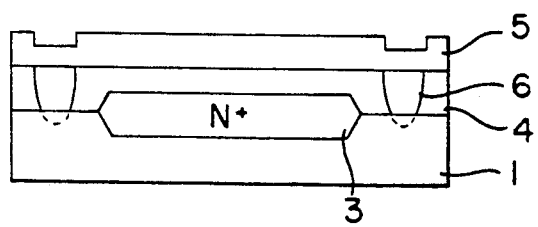
Figure 1E:
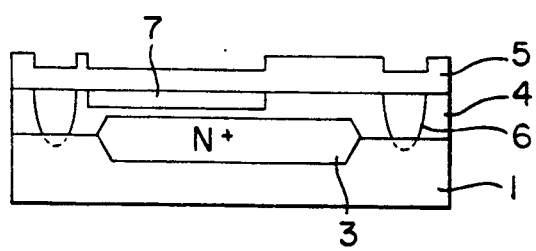
Figure 1F:
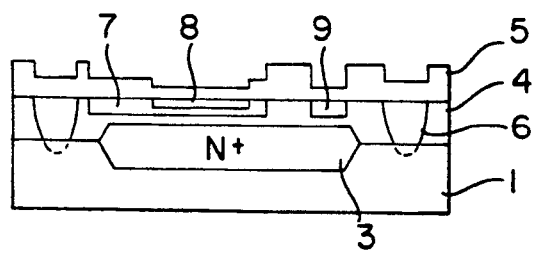
Figure 1G:
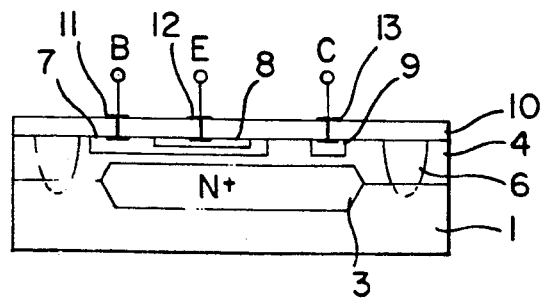
Figure 2A:
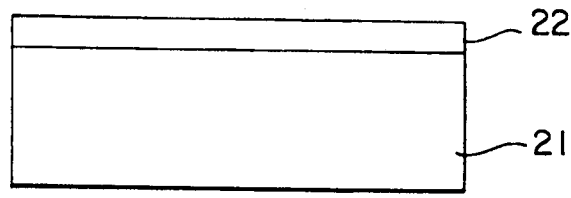
FIGS. 2(A)–(F) are the diagrams of manufacturing process of a conventional CMOS element.
Figure 2B:
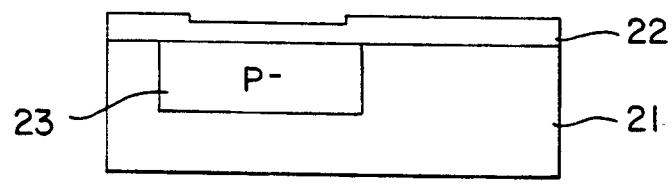
Figure 2C:
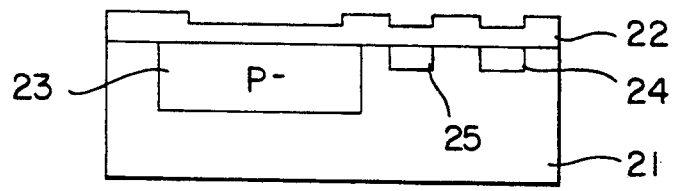
Figure 2D:
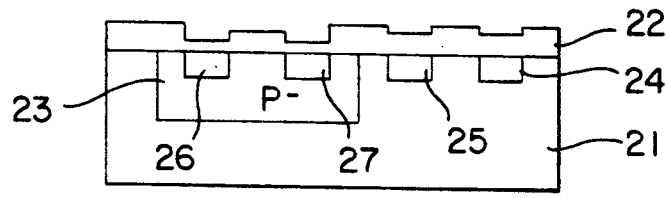
Figure 2E:
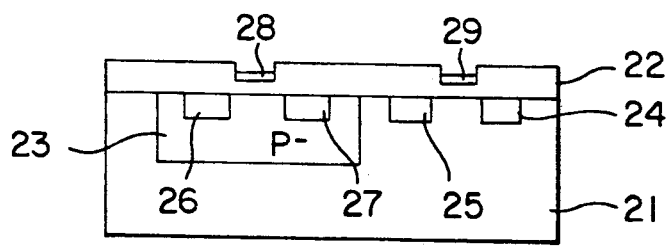
Figure 2F:
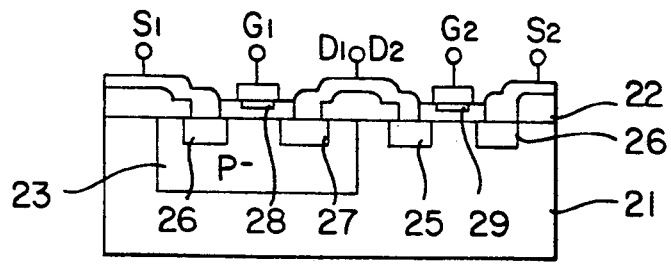
Figure 3A:
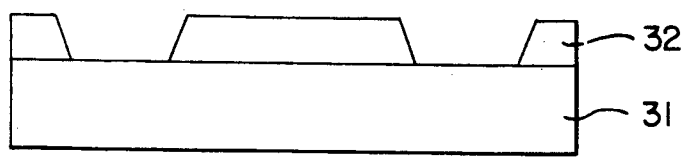
FIGS. 3(A)–(H) are the diagrams of manufacturing process of Bi-CMOS by trenching according to the present invention.
Figure 3B:
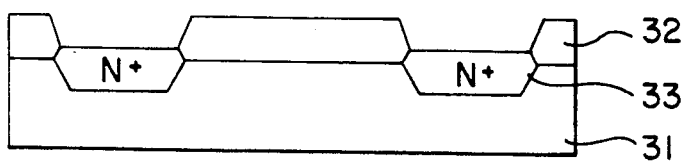
Figure 3C:
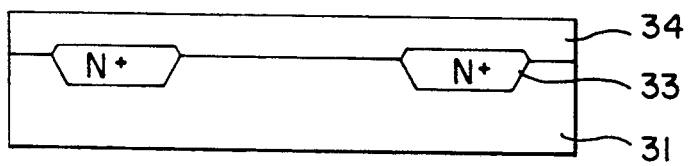

FIGS. 3(A)–(H) are the diagrams of manufacturing process of Bi-CMOS element by trenching according to the present invention, in which firstly as shown in FIG. 3(A), an oxide layer 32 of silicon oxide ($SiO_2$) is formed on the surface of p-type silicon substrate 31, and said oxide layer 32 is selectively etched by a masking and etching, then as shown in FIG. 3(B), $N^+$ buried layer 33 is formed by diffusing a n-type impurity to the interior of p-type silicon substrate 31 through the selectively etched portion of said oxide layer 32, then as shown in FIG. 3(C), after said oxide layer 32 is removed, a n-type epitaxial layer 34 is grown on the p-type silicon substrate 31 with the thickness below 5 $\mu$m.

Figure 3D:
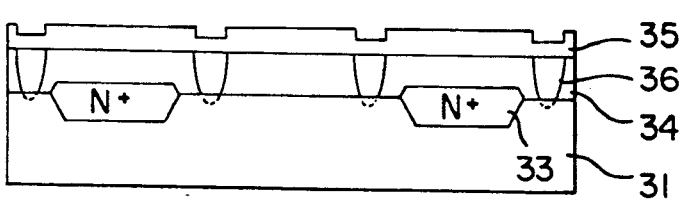
Figure 3E:
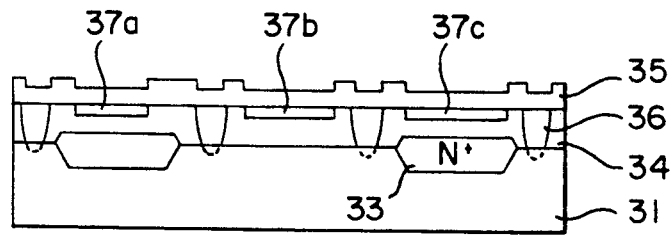
Figure 3F:
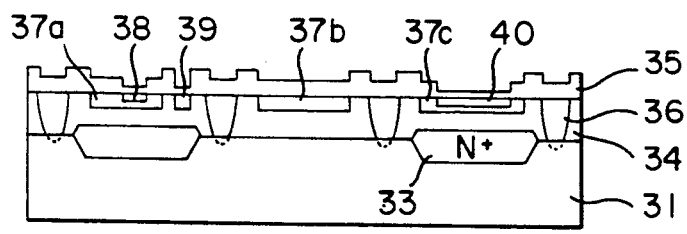
Figure 3G:
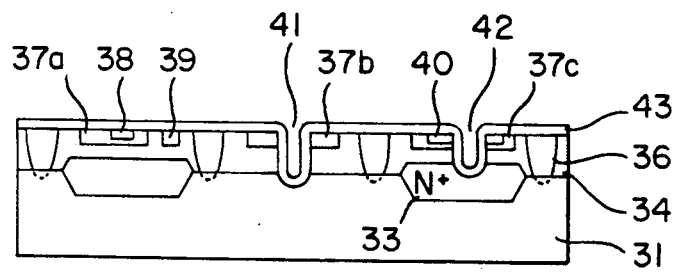

Thereafter, as shown in FIG. 3(D), another more oxide layer 35 is formed again over entire surface of the n-type epitaxial layer 34, after said oxide layer 35 is selectively etched by a masking and an etching and then a plurality of isolation regions 36 are formed by diffusing a boron impurity. Then as shown in FIG. 3(E), said oxide layer 35 is selectively etched by the masking and etching, and then base regions 37a, 37b, 37c are formed at said selectively etched portion, then as shown in FIG. 3(F), said oxide layer 35 is selectively etched so that an emitter region 38, a collector region 39 and a n-channel drain region 40 are formed respectively. Thereafter as shown in FIG. 3(G), said oxide layer 35 is removed, then the intermediate portion of base region 37b of said p-channel is etched in a trenching manner so that a trenched groove 41 is formed, at the same time a trenched groove 42 is formed by etching in a trenching manner the intermediate portion of said n-channel base region 37c, a polycrystal silicon is diffused to said trenched grooves 41, 42 so that the epitaxial layer 34 around the proximity of said trenched grooves 41, 42 is inverted, thereafter an oxide layer 43 is formed thereon.

Figure 3H:
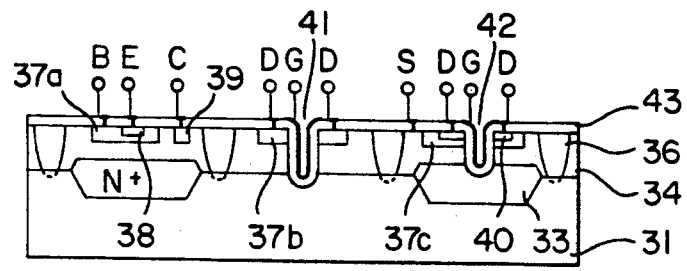

In the above description, an etching in a trenching manner or a trench etching is meant that an induced gas such as $CBrF_3$ is applied, and a plasma is formed by applying a high frequency power, so that a predetermined portion on the silicon substrate 31 is etched deeply by said plasma. Then as shown in FIG. 3(H), the electrode window is opened by selectively etching said oxide layer 43, and then the electrode terminals B, E, C of the base, emitter and collector drawn out by depositing the metal such as aluminum, at the same time the electrode terminals D, S, G of drain, source and gate are drawn out, so that the manufacturing of Bi-CMOS is completed.

A Bi-CMOS element of the present invention thus manufactured, of which left side portion formed with the base region 37a, emitter region 38 and collector region 39 is operated as a bipolar element, while the intermediate portion formed with the base region 37b and trenched groove 41 is operated as a p-channel of CMOS, and the right side portion formed with the base region 37c, drain region D and trenched groove 42 is operated as a n-channel of CMOS, respectively.

As described in detail hereinabove, the present invention has the effects that the integrating degree of the elements can be enhanced because CMOS element is manufactured by utilizing the trench etching, and two different functions can be carried out with one element because a bipolar element and CMOS element are simultaneously manufactured on a same substrate, therefore the assembling process becomes simplified, and the cost becomes saved as well as of course the compactness of appliance being expected.

What is claimed is:

1. A manufacturing method for a Bi-CMOS by trenching comprising the following steps of:

growing an oxide layer of silicon oxide on a surface of a p-type silicon substrate;

forming a $N^+$ buried layer by diffusing a n-type impurity after selectively etching said oxide layer;

removing said oxide layer; growing a n-type epitaxial layer on said p-type silicon substrate; growing an oxide layer on said epitaxial layer;

forming a plurality of isolation regions by diffusing a boron impurity after selectively etching said oxide layer;

forming base regions after selectively etching again said oxide layer, etching again said oxide layer, and then forming the emitter region, collector region and drain region of n-channel, respectively; removing said oxide layer;

forming trenched grooves by trench etching the intermediate portion of a second base region of said p-channel and the intermediate portion of a third base region of said n-channel;

growing an oxide layer again after inverting the epitaxial layer in the proximity around said trenched grooves by diffusing a polycrystal silicon into said trenched grooves;

opening an electrode window by selectively etching said oxide layer; and depositing a metal so that the electrode terminals of the base, emitter and collector of the bipolar element and the electrode terminals of the drain, source and gate of CMOS element are drawn out, respectively.

* * * * *